(12) United States Patent
Geneste et al.

(10) Patent No.: US 9,791,476 B2
(45) Date of Patent: Oct. 17, 2017

(54) DEVICE FOR DIFFERENTIAL ACQUISTION OF CURRENT AND METHOD OF CONTROLLING SUCH AN ACQUISITION DEVICE

(71) Applicant: SAGEM DEFENSE SECURITE, Boulogne Billancourt (FR)

(72) Inventors: Nicolas Geneste, Boulogne Billancourt (FR); Joel Vanoli, Boulogne Billancourt (FR); Francis Chaminadas, Boulogne Billancourt (FR)

(73) Assignee: Safran Electronics & Defense, Boulogne Billancourt (FR)

( * ) Notice: Subject to any disclaimer, the term of this patent is extended or adjusted under 35 U.S.C. 154(b) by 36 days.

(21) Appl. No.: 14/787,161

(22) PCT Filed: Apr. 23, 2014

(86) PCT No.: PCT/EP2014/058283
§ 371 (c)(1),
(2) Date: Nov. 3, 2015

(87) PCT Pub. No.: WO2014/173981
PCT Pub. Date: Oct. 30, 2014

(65) Prior Publication Data
US 2016/0077132 A1 Mar. 17, 2016

(30) Foreign Application Priority Data
Apr. 26, 2013 (FR) ...................................... 13 53825

(51) Int. Cl.
*G01R 19/00* (2006.01)
*G01R 15/14* (2006.01)
(Continued)

(52) U.S. Cl.
CPC .............. *G01R 15/14* (2013.01); *G01D 18/00* (2013.01); *G01P 21/00* (2013.01)

(58) Field of Classification Search
CPC ............... G01P 15/125; G01P 15/0802; G01P 2015/0814; G01P 15/18; G01P 21/00;
(Continued)

(56) References Cited

U.S. PATENT DOCUMENTS 4,345,474 A * 8/1982 Deval ................... G01P 15/131
73/514.18
5,454,266 A * 10/1995 Chevroulet ........... G01P 15/131
73/514.18
(Continued)

*Primary Examiner* — Vinh Nguyen
(74) *Attorney, Agent, or Firm* — Muncy, Geissler, Olds & Lowe, P.C.

(57) ABSTRACT

A device for the differential acquisition of current includes an acquisition circuit including a charge amplifier connected, at the input, to terminals for connection to a signal emitting component, and at the output, to an integrator. A unit for injecting a charge signal is mounted between the terminals and the charge amplifier and is connected to a control unit connected to an output of the acquisition circuit. The control unit is so arranged as to control the injection of a charge signal, to detect a resultant signal at the output of the acquisition circuit and to compare the resultant signal with the injected signal. A method includes controlling such a device.

16 Claims, 2 Drawing Sheets

Figure 4:
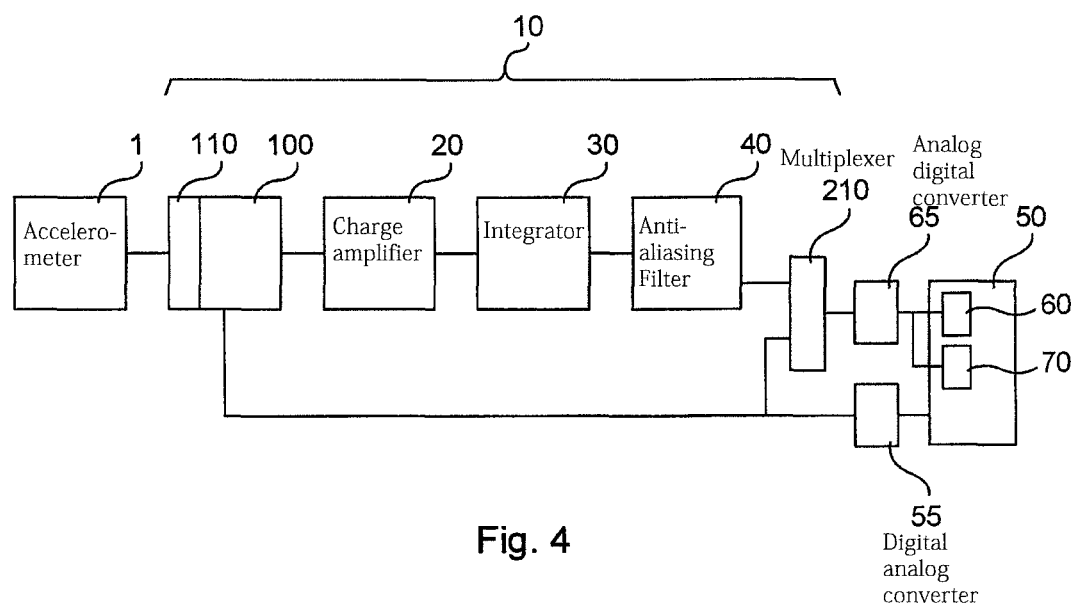

(51) Int. Cl.
*G01P 21/00* (2006.01)
*G01D 18/00* (2006.01)

(58) Field of Classification Search
CPC .... G01P 15/02; G01P 15/13; G01P 2015/082; G01P 2015/0831; G01P 2015/0865; G01P 15/00; G01P 15/131; G06F 3/044; G06F 2203/041; G06F 3/0416; G01D 18/00; G01D 5/2448; H03F 2203/30099; H03F 3/4565; H03F 3/45753; H03F 3/45977; G01R 15/14; G01R 27/26; G01R 27/2605; G01R 31/2891; G01R 31/312; G01R 35/00; H03K 19/0175; H03K 2217/96074; H03K 2217/960725; H04Q 9/14

See application file for complete search history.

(56) References Cited

U.S. PATENT DOCUMENTS

| | | | |
|---|---|---|---|
| 6,498,501 B2 * | 12/2002 | Broillet | G01H 11/08 324/667 |
| 2002/0008527 A1 | 1/2002 | Broillet | |
| 2012/0105077 A1 | 5/2012 | Geneste et al. | |
| 2012/0240667 A1 | 9/2012 | Geneste et al. | |

* cited by examiner

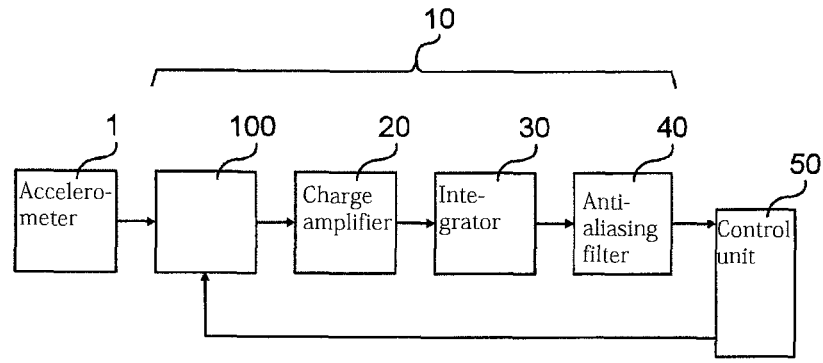
Fig. 1
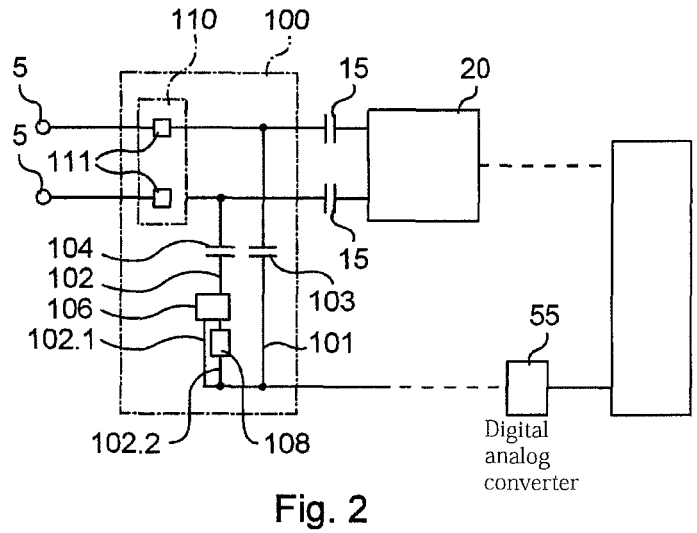
Fig. 2
Fig. 3

DEVICE FOR DIFFERENTIAL ACQUISTION OF CURRENT AND METHOD OF CONTROLLING SUCH AN ACQUISITION DEVICE

The present invention relates to a differential acquisition device and a method for controlling such an acquisition device.

Charge acquisition circuits are known, which are connected to the terminals of sensors such as accelerometers, for instance.

Such an acquisition circuit generally comprises a charge amplifier the input of which is connected to the sensor and the output of which is connected, for example, to an integrator connected to a filtering element. A differential acquisition of current making it possible to provide a signal which may be used to determine the magnitude detected by the sensor, is thus obtained.

When the sensor is mounted to provide a signal when a specific event, such as a failure or a vibration of a device equipped with the sensor occurs, the absence of signal at the output of the acquisition circuit may result either from the absence of the event in question, or from a failure (short circuit, open circuit . . . ) of the acquisition circuit and/or of the sensor.

A method for detecting the failure of an accelerometer which is connected to a voltage acquisition circuit is known from the document U.S. Pat. No. 8,099,993. The method consists in injecting a high frequency voltage signal on the positive terminal of the accelerometer and in observing the feedback signal on the negative terminal of the sensor to compare it with the injected signal and to deduce therefrom the absence or the existence of a sensor failure.

Such method cannot however be used with any acquisition circuit. As a matter of fact, injecting a voltage signal is not adapted to a current differential acquisition circuit due to the existence of a virtual mass.

An object of the invention is thus to provide means for detecting a failure in a differential acquisition circuit.

To this end, and according to the invention, a current differential acquisition device, comprising an acquisition circuit comprising a charge amplifier the input of which is connected to terminals for connecting to a signal emitting component and the output of which is connected to an integrator. A charge signal injection unit is mounted between the terminals and the charge amplifier and is connected to a control unit connected to an output of the acquisition circuit, the control unit is so arranged as to control the injection of a charge signal, to detect a resultant signal at the output of the acquisition circuit and to compare the resultant signal to the injected signal.

The emitting component is for example a sensor. Injecting a charge signal (as a test signal) upstream of the charge amplifier and comparing the charge signal with the resultant signal obtained at the output of the acquisition circuit makes it possible to detect failures in the acquisition circuit. For example, failures in the acquisition circuit are detected using test signals injected in differential mode while isolating the emitting component of the acquisition circuit and short to ground outside the acquisition chain are detected using test signals injected in common mode.

The invention also relates to a method for controlling such an acquisition device. The method comprises a nominal acquisition phase wherein a signal from the emitting component is differentially amplified and then integrated to supply a measurement signal at the output of the acquisition circuit. The method comprises a failure detection phase which comprises the steps of:
injecting at least one charge sine-wave signal between the terminals for connection to the emitting component and the charge amplifier,
taking off a resultant signal at the output of the acquisition circuit,
comparing the resultant signal with the injected signal for determining a working condition of the acquisition circuit.

Other characteristics and advantages of the invention will become apparent upon reading the following description of particular non-restrictive embodiments of the invention.

Reference is made to the appended drawings, wherein:

FIG. 1 is a schematic view of an acquisition device according to a first embodiment of the invention, FIG. 2 is a detailed view of such acquisition device, FIG. 3 is a view similar to FIG. 1 of the acquisition device according to a second embodiment, FIG. 4 is a view similar to FIG. 1 of an alternative solution for the second embodiment of the invention.

The invention is described here in connection with the detection of vibration using at least one accelerometer. The accelerometer provides a signal the electric charge of which is representative of the acceleration, a signal which is amplified prior to being integrated to obtain an output signal representative of speed. The accelerometer is for example attached to a device liable to vibrate, such as a motor or the structure of an aircraft.

Referring to the figures, the accelerometer 1 is connected to an acquisition device comprising an acquisition circuit generally designated 10. The invention is applicable to any type of sensor and more generally to any type of load or current differential acquisition circuit.

The acquisition circuit 10 includes a charge amplifier 20, here mounted as a differential integrating amplifier, connected, at the input, to the accelerometer 1 and at the output to an integrator 30. The charge amplifier 20 and the integrator 30 have a conventional construction and will not be explained in details here. The charge amplifier 20 has an input impedance close to 0 Ohm.

The integrator 30 has an output connected to an anti-aliasing filter 40 itself connected to a control unit 50 via an analog digital converter integrated here in the control unit 50. The control unit 50 is knowingly arranged to carry out a nominal acquisition phase wherein a signal from the accelerometer 1 is differentially amplified and then integrated to supply, at the output of the anti-aliasing filter, a measurement signal which can be used either by the control unit 50 itself or by a device connected to the control unit 50. The control unit 50 can be dedicated to one or more acquisition circuit(s) or be a part of a larger control assembly as the FADEC in case the device is aboard an aircraft to monitor the operation of an engine of the aircraft.

The acquisition circuit 10 is thus so arranged as to receive as an input a signal representative of the acceleration which the accelerometer 1 is subjected to and to output a signal representative of the speed which the accelerometer 1 is subjected to. The integrator 30 can of course be omitted within the scope of the invention if acceleration only is monitored, or two successive integrators 30 can be used if position is monitored. When using two successive integrators 30, the output signal can be taken off at the output of the charge amplifier 20 and each of the integrators 30 to obtain three signals representative of acceleration, speed and position, respectively.

More specifically, the acquisition circuit 1 comprises two input branches extending between the terminals 5 for connection to the accelerometer 1 and charge amplifier inputs 20. Two capacitors 15 are each mounted on one of the input branches.

According to the invention, a test signal injection unit 100 is connected upstream of the charge amplifier 20 and the capacitors 15, and is connected to the control unit 50. The control unit 50 is so arranged as to control the injection of a charge sine-wave signal making up the test signal, to detect a resultant signal at the output of the acquisition circuit 10 and to compare the resultant signal with the injected test signal.

More specifically, in the first embodiment of the invention and with reference to FIGS. 1 and 2, the injection unit 100 comprises a multiplexing member 110. The multiplexing member 110 comprises switches 111 which are each mounted on one of the input branches between one of the terminals 5 and one of the capacitors 15 and which have an on-state and an off-state. The multiplexing member 110 is connected to the control unit 50 for selectively connecting the terminals 5 to the capacitors 15, and thus to the charge amplifier 20 and for isolating the terminals 5 of the capacitors 15, and thus of the charge amplifier 20.

The injection unit 100 is connected to a voltage source, here a digital analog converter 55 controlled by the control unit 50, at the output of which two lines 101, 102 each connected to one of the input branches of the acquisition circuit between the switch 111 and the capacitor 15, are connected. The lines 101, 102 each include a capacitor 103, 104 respectively. The line 102 is divided into two branches 102.1, 102.2 connected to a switch 106 which is mounted upstream of the capacitor 104 and which has a first switching state and a second switching state for selectively connecting the capacitor 104 either to the branch 102.1 or to the branch 102.2. The switch 106 is connected to the control unit 50 to be controlled by the latter between its two switching states. The branch 102.1 directly connects the switch 106 to the output of the digital analog converter 55 and the branch 102.2 connects the switch 106 to the output of the digital analog converter 55 via an inverter 108. It should be understood that, when the switch is in its first switching state, the injection unit is so arranged as to inject the charge signal in common mode whereas, when the switch is in its second switching state, the injection unit is so arranged as to inject the charge signal in differential mode.

The acquisition device is controlled according to the following method, which comprises a nominal acquisition phase and a failure detection phase.

During the nominal acquisition phase, a signal from the accelerometer 1 is differentially amplified and then integrated to supply a measurement signal at the output of the acquisition circuit.

During the detection phase, the method comprises the steps of:
  injecting the test signal between the terminals 5 and the capacitors 15,
  taking off a resultant signal at the output of the acquisition circuit 10,
  comparing the resultant signal with the injected test signal for determining an operating condition of the acquisition circuit 10.

In the method of the invention two detection phases are executed in sequence. The first detection phase is executed during an initialization phase prior to the nominal acquisition phase and the second detection phase is executed during the nominal acquisition phase. The acquisition device of the invention thus incorporates diagnostic means (when used aboard an aircraft, called PBIT for "power-on built-in test", for the detection phase executed upon starting the acquisition circuit and CBIT for "built-in continuous test" for the detection phase continuously executed.

During the first detection phase, the control unit 50 controls the switches 111 in their off-state to isolate the acquisition circuit 10 of the accelerometer 1 and the switch 106 in its second switching state to inject the test signal in differential mode.

The test signal is injected during a step of injecting and the resultant signal is taken-off during a step of listening. These two steps are executed simultaneously. A failure of the acquisition circuit results in the level of the resultant signal being different from the expected level.

During the second detection phase, the control unit 50 controls the switches 111 in their on-state to connect the acquisition circuit 10 to the accelerometer 1 and the switch 106 in its first switching state to periodically inject the test signal in common mode. The resultant signal is extracted from an output signal of the acquisition circuit 10, with the output signal comprising the resultant signal and the measurement signal.

The test signal is injected during a step of injection and the resultant signal is taken-off during a step of listening. The two signals are compared. A failure creates an asymmetry on the amplitude of the resultant signal. If the connections to the accelerometer 1 are symmetrical, i.e. if no open circuit or short to ground exists, no significant difference will be detected when subtracting the signal of one input branch from the signal of the other input branch. In case of failure, a signal at the frequency of the test signal will appear at the output of the charge amplifier 20 thus revealing a malfunction of the accelerometer 1.

The frequency of the test signal is chosen in a frequency range such that:
  such frequency range is located outside the frequency range of the vibrations to be detected in nominal acquisition mode,
  such frequencies are below the resonance frequency of the accelerometer 1,
  such frequencies are below the frequency of the anti-aliasing filter 40.

The test signals common mode are preferably periodically injected so as to avoid an erroneous failure detection by:
  discriminating between the test signal and an harmonic of the signal from the accelerometer 1,
  discriminating between the test signal and an electromagnetic disturbance.

In another alternative solution, during the detection phase executed during the nominal acquisition phase, the method comprises a step of injecting a test signal in common mode and a step of injecting a test signal in differential mode, with the steps of injecting a signal following a step of listening for taking-off the resultant signals. The control unit 50 then advantageously comprises a filtering device for extracting, from an output signal of the acquisition circuit, the signal resulting from the injection of each of the test signals and the measurement signal.

Comparing preferably comprises checking a phase coherence between the test signal and the resultant signal. This ensures that the resultant signal is the one corresponding to the test signal and not noise. An amplitude change threshold can advantageously be defined, below which checking coherence is not necessary.

The method of the invention is implemented without modifying the accelerometer 1 and with limited changes in the acquisition circuit as regards the hardware relative to the existing acquisition circuits.

The elements identical with or similar to those described above are given the same reference numbers in the following description of the second embodiment.

The method of the second embodiment comprises two detection phases identical to those previously described.

In addition, in the method according to the second embodiment of the invention, the initialization phase is used to execute a compensation operation aiming at eliminating errors in the integration gains. As a matter of fact, it was found that the inaccuracies of the acquisition circuit are mainly due to integrations.

The method of the invention therefore comprises an initialization phase comprising the steps of:
  measuring integration gains (inclusive of the one executed during the charge amplification)
  determining at least one compensation coefficient according to the measured gain,
  applying the compensation coefficient to the measurement signal.

The step of measuring the integration gains is executed by injecting a calibration signal upstream of the charge amplifier 20, while having first disconnected the accelerometer 1 and the acquisition circuit 10. The calibration signal is a charge sine-wave signal like the test signals mentioned above. Its frequency is so determined that the integrations have a gain close to 1. The charge sine-wave signal is then compared to a resultant signal taken off at the output of the acquisition circuit in order to deduce the integration gain and the compensation gain therefrom.

The acquisition circuit 10 of the second embodiment is mainly identical with that of the first embodiment.

FIG. 3 successively shows the signal injection unit 100 with the multiplexer 110 and the digital analog converter 55, the charge amplifier 20, the integrator 30 and the anti-aliasing filter 40 connected to the control unit 50.

However, instead of being directly connected to the analog digital converter 65 of the control unit 50 as in the first embodiment, the anti-aliasing filter 40 is connected to a first input of a second multiplexer 210 which has an output connected to the analog digital converter 65 of the control unit 50 and a second input connected to the output of the digital analog converter 55. The multiplexer 210 has a first switching state wherein it connects the anti-aliasing filter 40 to the analog digital converter 65 of the control unit 50 and a second switching state wherein it connects the digital analog converter 55 to the analog digital converter 65 of the control unit 50.

During the step of injecting the calibration signal, the control unit 50 controls the switches 111 in their locked state and the multiplexer 210 in its second connection state and then controls the injection of the calibration signal. The control unit 50 then controls the multiplexer 210 in its first switching state.

Thus, the analog digital converter of the control unit 50 will successively receive the original calibration signal (via the second input of the multiplexer 210) and the resultant signal corresponding to the calibration signal after passing through the acquisition circuit 10 (via the first input of the multiplexer 210). The control unit 50 will calculate a ratio of the two signals and divides such ratio by the theoretical nominal gain of the acquisition circuit at the given frequency to obtain a compensation coefficient.

The step of compensation is executed continuously during the nominal acquisition phase. Each measurement signal recovered by the control unit 50 is then corrected with the compensation coefficient determined beforehand.

The execution of the step of detecting gain during the initialization phase makes it possible to compensate for the initial dispersions as well as the errors related to component ageing. It is estimated that about half of the overall error is thus compensated for.

In the alternative solution of FIG. 4, the step of detecting gain is also continuously executed during the nominal acquisition phase so as to also compensate for errors caused by temperature variations. It is estimated that about three-quarters of the overall error are compensated for.

In this alternative embodiment, two branches are provided within the control unit 50 at the output of the analog digital converter, i.e. a branch provided with a band-stop filter 60 making it possible to isolate the measurement signal and a branch provided with a band-pass filter 70 making it possible to isolate the resultant signal of the calibration signal.

The operation of the signal resulting from the calibration signal is identical with that of the second embodiment, which makes it possible to continuously update the compensation coefficient.

Of course, the invention is not limited to the described embodiments but encompasses any alternative solution within the scope of the invention as defined in the claims.

In particular, the acquisition circuit may have a different structure from the one described and incorporate, for instance, additional filter means, lightning protection means, a common mode choke at the input of the charge amplifier (in this case, the injection of the test signal is executed upstream of the common mode choke) . . . . The multiplexing member 110 may also be omitted.

The steps of detecting and listening can be simultaneous or not, continuous or periodic.

Alternately, the phase compensation is executed outside the nominal acquisition phase.

The analysis of the resultant signal may be a direct, analog or digital, comparison of the resultant signal with the injected signal. The analysis may also be an indirect comparison consisting in determining at least one characteristic of the resultant signal and in comparing same with an expected characteristic previously determined according to the injected signal.

The invention claimed is:

1. A device for the differential acquisition of current, comprising an acquisition circuit comprising a charge amplifier connected, at the input, to terminals for connection to a signal emitting component, and at the output, to an integrator, wherein a unit for injecting a charge signal is mounted between the terminals and the charge amplifier and is connected to a control unit connected to an output of the acquisition circuit, the control unit is so arranged as to control the injection of a charge signal, to detect a resultant signal at the output of the acquisition circuit and to compare the resultant signal with the injected signal, and wherein the injection unit comprises a channel of injection in common mode and a channel of injection in differential mode, and a switch controlled by the control unit to select the one or the other of the injection channels.

2. The device according to claim 1, wherein the injection unit is so arranged as to inject the charge signal in common mode.

3. The device according to claim 1, wherein the injection unit is so arranged as to inject the signal charge in differential mode.

4. The device according to claim 1, wherein the injection unit comprises a multiplexing member connected to the control unit for selectively connecting the terminals to the charge amplifier and to isolate the terminals of the charge amplifier.

5. The device according to claim 1, wherein the injection unit comprises a digital analog converter having one input connected to the control unit and one output connected to the input of the charge amplifier.

6. The device according to claim 1, wherein the control unit comprises a filtering member for extracting the resultant signal and a measurement signal from an output signal of the acquisition circuit.

7. A method for controlling a current differential acquisition device according to claim 1, comprising a nominal acquisition phase wherein a signal from the emitting component is differentially amplified and then integrated for supplying a measurement signal at the output of the acquisition circuit, wherein the method includes a fault detection phase comprising the steps of:
  injecting at least one charge sine-wave signal upstream of the charge amplifier,
  taking off a resultant signal at the output of the acquisition circuit,
  comparing the resultant signal with the injected signal for determining a working condition of the acquisition circuit,
  the method comprising the step of selecting between the injection of the charge sine-wave signal in differential mode and the injection of the charge sine-wave signal in commode mode.

8. The method according to claim 7, wherein the step of detecting is executed during the nominal acquisition phase and the resultant signal is extracted from an output signal of the acquisition circuit, with the output signal comprising the resultant signal and the measurement signal.

9. The method according to claim 8, wherein the signal injection is periodically executed.

10. The method according to claim 7, wherein the step of detecting is executed outside the nominal acquisition phase.

11. The method according to claim 7, comprising a step of injecting a charge signal in common mode and a step of injecting a charge signal in differential mode, with the steps of injecting the signal following a step of listening for sampling the resultant signals.

12. The method according to claim 7, wherein comparing comprises checking a phase coherence between the injected signal and the resultant signal.

13. The method according to claim 7, comprising a compensation phase comprising the steps of:
  measuring an integration gain,
  determining at least one compensation coefficient according to the measured gain, and
  applying the compensation coefficient to the measurement signal.

14. The method according to claim 13, wherein measuring the integration gain is executed by injecting a charge sine-wave signal upstream of the amplifier and comparing the charge sine-wave signal with a resultant signal taken off at the output of the acquisition circuit in order to deduce therefrom the integration gain and the compensation gain.

15. The method according to claim 14, wherein the compensation phase is executed during the nominal acquisition phase and the resultant signal is extracted from an output signal of the acquisition circuit, with the output signal comprising the resultant signal and the measurement signal.

16. The method according to claim 14, wherein the compensation phase is executed outside the nominal acquisition phase.

* * * * *